(12) United States Patent
Despesse

(10) Patent No.: US 8,588,439 B2
(45) Date of Patent: Nov. 19, 2013

(54) FLEXIBLE DIELECTRIC VARIABLE CAPACITANCE SYSTEM

(75) Inventor: Ghislain Despesse, Saint Egreve (FR)

(73) Assignee: Commissariat a l'energie atomique et aux alternatives, Paris (FR)

( * ) Notice: Subject to any disclaimer, the term of this patent is extended or adjusted under 35 U.S.C. 154(b) by 333 days.

(21) Appl. No.: 13/120,805

(22) PCT Filed: Sep. 24, 2009

(86) PCT No.: PCT/EP2009/062357
§ 371 (c)(1),
(2), (4) Date: Jun. 10, 2011

(87) PCT Pub. No.: WO2010/034764
PCT Pub. Date: Apr. 1, 2010

(65) Prior Publication Data
US 2011/0234043 A1    Sep. 29, 2011

(30) Foreign Application Priority Data

Sep. 25, 2008 (FR) .................................. 08 56460

(51) Int. Cl.
*H04R 25/00* (2006.01)
(52) U.S. Cl.
USPC .......................................... 381/191; 381/174
(58) Field of Classification Search
USPC .......... 381/113, 116, 174, 191; 310/300, 311, 310/328, 332; 367/170, 181
See application file for complete search history.

(56) References Cited

U.S. PATENT DOCUMENTS

| | | | |
|---|---|---|---|
| 4,041,446 A | 8/1977 | Liebermann | |
| 5,677,965 A | 10/1997 | Moret et al. | |
| 7,062,052 B2* | 6/2006 | Kajihara et al. | ............ 381/174 |
| 7,260,424 B2 | 8/2007 | Schmidt | |
| 7,781,935 B2 | 8/2010 | Jager et al. | |
| 7,808,766 B2 | 10/2010 | Despesse et al. | |

(Continued)

FOREIGN PATENT DOCUMENTS

| CN | 1547312 A | 11/2004 |
|---|---|---|
| EP | 1 686 599 A1 | 8/2006 |

(Continued)

OTHER PUBLICATIONS

International Search Report and Written Opinion issued Feb. 4, 2010, in PCT/EP2009/062357 with English translation.

(Continued)

*Primary Examiner* — Tuan D Nguyen
(74) *Attorney, Agent, or Firm* — Oblon, Spivak, McClelland, Maier & Neustadt, L.L.P.

(57) ABSTRACT

A variable capacitance system including a first electrode, a second electrode, and a layer of elastically deformable dielectric material positioned between the first and the second electrode. An electret forms with the first electrode a first capacitor, and the electret forms with the second electrode a second capacitor. Capacitances of the first and second capacitors vary with deformation of the dielectric layer. The first electrode, the second electrode, and the first electret follow deformations of the dielectric layer and a deformation of the dielectric layer causes an inverse variation of capacitances of the first and of the second capacitor. The first electrode includes slots in which the electret is located, wherein the edge of the slots forms with the electret located inside the slots the first capacitor, wherein the electret is made on or in the dielectric layer.

37 Claims, 8 Drawing Sheets

(56) References Cited

U.S. PATENT DOCUMENTS

| | | |
|---|---|---|
| 2002/0168073 A1* | 11/2002 | Kajihara et al. ............ 381/113 |
| 2003/0118203 A1 | 6/2003 | Raicevich |
| 2003/0123683 A1 | 7/2003 | Raicevich |
| 2004/0007377 A1 | 1/2004 | Fouillet et al. |
| 2004/0007877 A1 | 1/2004 | Boland et al. |
| 2004/0207369 A1 | 10/2004 | Landolt |
| 2007/0007770 A1 | 1/2007 | Jager et al. |
| 2007/0029894 A1 | 2/2007 | Yamaoka et al. |
| 2007/0188046 A1 | 8/2007 | Chaillout et al. |
| 2007/0242843 A1* | 10/2007 | Matsuzawa et al. ......... 381/191 |
| 2007/0242847 A1* | 10/2007 | Gorelik et al. ............... 381/355 |
| 2008/0048521 A1 | 2/2008 | Mabuchi et al. |
| 2008/0211342 A1 | 9/2008 | Despesse |
| 2010/0264870 A1 | 10/2010 | Despesse |
| 2010/0295415 A1 | 11/2010 | Despesse et al. |

FOREIGN PATENT DOCUMENTS

| | | |
|---|---|---|
| FR | 2 841 063 A1 | 12/2003 |
| WO | WO 01/67810 A1 | 9/2001 |
| WO | WO 03/079384 A2 | 9/2003 |

OTHER PUBLICATIONS

French Preliminary Search Report issued Apr. 9, 2009, in French Patent Application No. 0856460 with English translation of category of cited documents.

Fabio Peano, et al., "Design and Optimization of a MEMS Electret-Based Capacitive Energy Scavenger", Journal of Microelectromechanical Systems, vol. 14, No. 3, XP-002523269, Jun. 2005, pp. 429-435.

Claire Jean-Mistral, et al., "Dielectric Polymer: scavenging energy from human motion", (EAPAD) Proceedings of SPIE, vol. 6927, 2008, pp. 692716-1 to 692716-10.

T. Tsutsumino, et al., "Efficiency Evaluation of Micro Seismic Electret Power Generator", Proceedings of the $23^{rd}$ Sensor Symposium, 2006, pp. 521-524.

T. Sterken, et al., "An Electret-Based Electrostatic µ-generator", Transducers'03, The $12^{th}$ International Conference on Solid State Sensors, Actuators and Microsystems, Boston, Jun. 8-12, 2003, pp. 1291 1294.

T. Sterken, et al., "Harvesting Energy From Vibrations by a Micromachined Electret Generator", 2007 IEEE, pp. 129-132.

M. G. Pollack, et al., "Electrowetting-based actuation of droplets for integrated microfluidics", Lab Chip, vol. 2, No. 1, XP-008038786, 2002, pp. 96-101.

Hsi-wen Lo, et al., "Parylene-HT-Based Electret Rotor Generator", MEMS 2008, Jan. 13-17, 2008, pp. 984-987.

Samuel Rosset, et al. "Ion-implanted compliant and patternable electrodes for miniaturized dielectric elastomer actuators", Proceedings SPIE, vol. 6927, 2008, pp. 69270W-1 to 69270W-10.

Guggi Kofod, et al., "Actuation response of Polyacrylate dielectric elastomers", Journal of Intelligent Material Systems and Structures, vol. 14, No. 12, 2003, pp. 787-793.

* cited by examiner

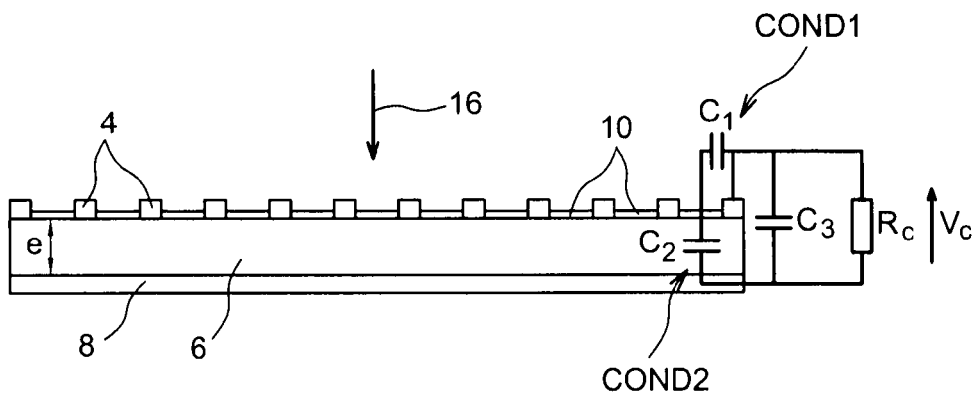
FIG. 1
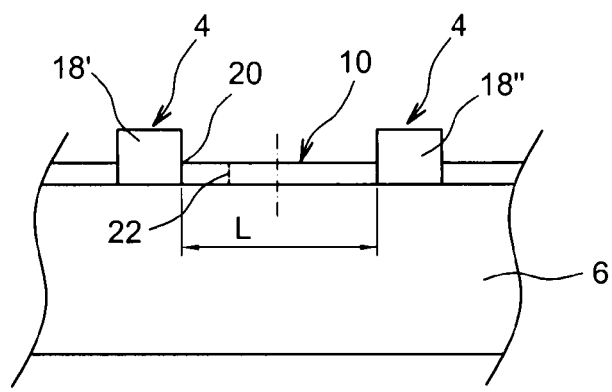
FIG. 1'
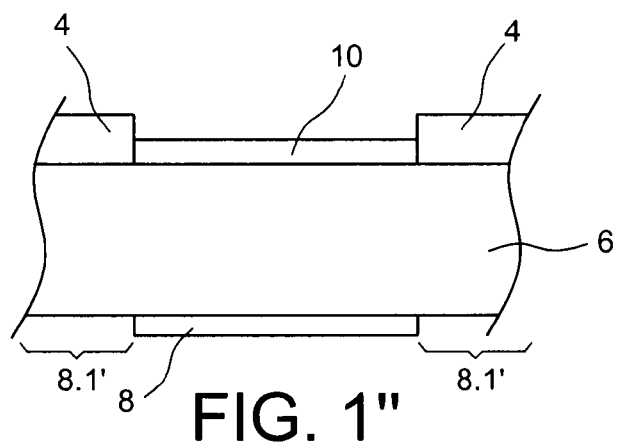
FIG. 1"

FLEXIBLE DIELECTRIC VARIABLE CAPACITANCE SYSTEM

TECHNICAL FIELD AND PRIOR ART

The present invention relates to variable capacitance devices used to recuperate energy or as actuators through the application of a voltage to their terminals, more particularly to variable capacitance devices polarised by one or several electret(s).

In the energy recuperation field, it is known to use variable capacitance systems having at least one fixed electrode, and at least one mobile electrode opposite, wherein the electrodes are separated by an air gap. The mobile electrode is moved by external vibrations and by the injection and withdrawal of a charge into the system at precise moments, it is thus possible to convert the vibratory energy into electrical energy.

Systems using an air gap formed by a deformable polymer are also familiar, for example from the document "Dielectric polymer: scavenging energy from human motion", by Claire Jean-Mistral, Skandar Basrour, Jean-Jacques Chaillout, in "Electroactive Polymer Actuators and Devices" (EAPAD) 2008 edited by Bar-Cohen, Yoseph, Proceedings of the SPIE, Volume 6927, pp. 692716-1-692716-10 (2008). These systems also require a polarising of the structure at each cycle to create energy recuperation cycles. This polarising requires electronic means for the transfer of the electric charges to the electrostatic structure, a minimum energy to be available at all times and to detect the maximum capacitance. This causes considerable electrical losses and makes the system very complex.

It is also familiar to use electrets to polarise electrodes. In this case, the structure no longer needs to be polarised at each cycle; the injection and withdrawal of the charges no longer needs to be managed. As a reminder, an electret is an electrically insulating material in which electric charges are stored, either electrons or ions. An electret permits a polarising to be imposed however it does not permit the current to be conducted.

Energy recuperation systems which implement electrets are known. For example, the document "Efficiency Evaluation of Micro Seismic Electret Power Generator", by T. Tsutsumino, Y. Suzuki, N. Kasagi, K. Kashiwagi, Y. Morizawa in "Proceedings of the 23rd Sensor Symposium", 2006, Takamatsu, pp. 521-524. The structure described in this document comprises an electret deposited on a base electrode and which forms with this electrode, a fixed capacitance capacitor, and a mobile electrode separated from the electret by a layer of air, which forms with the electret a variable capacitance capacitor. The mobile electrode moves in parallel to the electret. The variation of the capacitance of the capacitor formed by the mobile electrode and the electret is obtained by a variation of the opposite surfaces.

In function of the position of the mobile electrode, the electric charges are redistributed between the base electrode and the mobile electrode via a charge resistor between the base electrode and the mobile electrode.

Other variable capacitance energy recuperation systems which use an electret are also known from the documents "An Electret-based Electrostatic μ-generator" T. Sterken, P. Fiorini, K. Baert, R. Puers, G. Borghs,), TRANSDUCERS '03, The 12th International Conference on Solid State Sensors, Actuators and Microsystems, Boston, Jun. 8-12, 2003, 0-7803-7731-1/03/$17.00 © 2003 IEEE 1291, pages 1291-1294, and "Harvesting Energy from Vibrations by a Micormachined Electret Generator", T. Sterken, P. Fiorini, G. Altena, C. Van Hoof and R. Puers, 1-4244-0842-3/07/$20.00© 2007 IEEE, pages 129-132.

Whereas it is preferable to be able to create such variable capacitance systems with an air gap made from deformable dielectric material, in which there are no problems related to the polarising.

Consequently this is one purpose of the present invention, to provide a variable capacitance system comprising an air gap made from elastically deformable material, of simplified design with respect to the existing systems.

DESCRIPTION OF THE INVENTION

The purpose mentioned above is achieved by a system comprising at least two electrodes separated by a dielectric material, wherein at least one of the electrodes has at least two portions that may move closer together or further away from one another, wherein an electret is located in the space between these portions. The electret forms with the first electrode a first variable capacitance capacitor and the electret and the second electrode form a second variable capacitance capacitor.

In other terms, a system is created which converts mechanical energy into electrical energy or electrical energy into mechanical energy by the deformation of its electrodes, wherein the system comprises at least two variable capacitance capacitors, each polarised by an electret, and the capacitances of the capacitors vary inversely when the system is deformed. Thus when the capacitance of one increases, the capacitance of the other decreases. This contrary variation of the capacitances causes a transfer of charge between the electrodes and the generation of electrical energy.

One embodiment comprises a structure with cut outs that may deform elastically in its plane, wherein the electret is located inside the windows thus formed. By means of the use of at least one electrode with cut outs, it is possible to obtain on a same dielectric a variation that is inverse to the capacitances, which causes a variation in the charge in each of the electrodes and thus the creation of a current between the electrodes.

It is also possible to use electrodes with a helically wound wire, wherein the wire wound around or that is surrounded by the dielectric and the electret is between two wire turns.

Especially advantageously, the two electrodes have cut outs, which permits the quantity of electrical energy recuperated to be increased, or the two electrodes are in the form of helically wound wire.

The subject-matter of the present invention is mainly a variable capacitance system comprising a first electrode, a second electrode, a layer made of elastically deformable dielectric material, wherein said dielectric layer is positioned between the first and the second electrode, and a first electret forms with the first electrode a first capacitor, and the first electret forms with the second electrode a second capacitor, wherein the capacitances of the first and second capacitor vary with a deformation of the dielectric layer, the first electrode, the second electrode and the first electret are such that they follow the deformations of the dielectric layer and a deformation of the dielectric layer causes an inverse variation of the capacitances of the first and second capacitor, and the first electrode comprises at least two portions that may move closer together or further away from one another, wherein said electret is located between said two portions of the first electrode, and the edges of the portions form with the first electret the first capacitor, wherein said first electret is on or in the dielectric layer.

In one embodiment, at least the first electrode is equipped with at least one slot in which the first electret is located, wherein the edge of said slot forms with the first electret located in said slot the first capacitor, wherein said first electret is on or in the dielectric layer.

In another embodiment, the variable capacitance system has a cylindrical form with a longitudinal axis and in which the first electrode is formed by a wound electrically conductive wire with a longitudinal axis forming a succession of turns, wherein the first electret is located between two successive turns.

The second electrode may be a substantially solid layer and is covered by the dielectric layer, wherein the first electrode which covers the electric layer on a face opposite to that in contact with the second electrode.

In one variant, the second electrode may be formed by a wound electrically conductive wire with a longitudinal axis forming a succession of turns, wherein a second electret is located between at least two successive turns, wherein the turns of the first and second electrodes are offset so that the first and second electrets are not aligned according to a radial direction.

In another variant, the second electrode also comprises at least one slot in which a second electret is located with a charge opposite to that of the first electret, so that the second electrode forms with the second electret a fourth variable capacitance capacitor, and the first electrode forms with the second electret a fifth variable capacitance capacitor, wherein the capacitances of the first and fourth capacitors vary in the same direction, and the capacitances of the second and fifth capacitor vary in the same direction with the deformation of the dielectric layer.

For example, the first and/or the second electret may substantially be positioned at the centre of said slot substantially punctually or at the centre of the zone defined by two successive turns substantially punctually. This embodiment is particularly advantageous in the case of a rigid electret.

In one variant, the first electret and/or the second electret fill(s) the slot and is (are) in contact with the edges of said slot, or the first electret and/or the second electret fill(s) the zone defined by the two successive turns, and is (are) in contact with said turns.

In another variant, the first electret and/or the second electret may be formed by ionisation of the dielectric layer defined by the slot, for example by the corona method. This embodiment avoids an additional deposit on the dielectric layer.

In one variant, the first electret and/or the second electret is (are) in the form of a powder deposited on the dielectric layer.

By way of example, the dielectric layer is made of polymer, for example of the type VHB®, advantageously VHB F9460, VHB F9469, VHB F9473, VHB4905® or even VHB4910®, and the first and second electrodes are made for example from copper, silver, silver grease, carbon powder, gold or conductive polymer.

Advantageously, the first and/or the second electrode(s) has (have) structures such that it (they) is (are) elastically deformable.

The first electrode and/or the second electrode may then be formed by a set of bars interconnected so that they form a lattice defining several slots, in each of which the first electret and/or the second electret is (are) located.

The lattice may be such that a deformation of the lattice in one direction of its plane causes no or little deformation in another direction contained in the plane. For example, the bars form tree structures located side by side electrically connected by the ends of their branches, or the bars form rows of parallel chevrons, wherein said rows are electrically interconnected by interconnection bars extending between two successive rows.

The lattice may also be such that a deformation of the lattice in one direction of its plane causes a deformation in another direction contained in the plane. In this case, the lattice may comprise rows of zigzag patterns, wherein two successive rows are offset by half a pitch, so that the zigzag patterns of two successive rows define rhomb shapes, wherein interconnection bars connect the points of the zigzag patterns of two successive rows, and these points are the summits of the rhombss.

The bars may also define honeycomb shaped slots. This form is especially adapted to the use of a rigid electret, punctually deposited in the centre of the slots.

Advantageously, the first and the second electrode are such that the capacitance of the capacitor formed by the first and the second electrode separated by the dielectric layer is minimal. To achieve this, it may be provided that the second electrode is structured so that the surfaces opposite the first and second electrodes are reduced.

The subject-matter of the present invention is also a variable capacitance assembly, comprising at least two systems according to the present invention, wherein said systems are superposed and a dielectric layer is interposed between the second electrode of one of the systems and the first electrode of the other system.

The subject-matter of the present invention is also a system for converting mechanical energy into electrical energy comprising at least one system according to the present invention, wherein the conversion of the mechanical energy into electrical energy occurs during a deformation phase of the dielectric layer from its initial form and during its return from a deformed form to its initial form.

The system for converting mechanical energy into electrical energy may be of the switch type, designed to send a command to an appliance, and the electrical energy produced during the first deformation phase is used to send the command to the appliance, and the conversion system is thus self-powered.

The variable capacitance system may be in the form of a cylindrical sleeve, wherein the wire(s) is/are wound along the axis of the sleeve, wherein said sleeve is fixed at its axial ends to two elements that may move closer together or further away from one another along the axis of the sleeve, so that a relative movement of the two elements axially deforms the sleeve. In one variant, the variable capacitance system comprises between its layers at the longitudinal ends of the sleeve fixed to the elements, a rigid film.

The subject-matter of the present invention is also an actuator comprising at least one system according to the present invention, wherein the application of a voltage between the first and the second electrode causes a deformation in a mean plane of the system and/or in a direction that is orthogonal to said mean plane, or a deformation along the longitudinal axis of the sleeve.

The subject-matter of the present invention is also a manufacturing method for a variable capacitance system according to the present invention, comprising the steps of:
 depositing the first electrode onto one face of the dielectric layer, for example by lithography,
 depositing a material designed to be to form the first electret in the at least one slot of the first electrode, for example Teflon or parylene,
 polarising of said material,
 depositing of the second electrode onto the other face of the dielectric layer, for example by lithography.

The method according to the invention may also comprise the additional steps of:

depositing of a material designed to be polarised to form the second electret in the at least one slot of the second electrode, for example Teflon or of the parylene, polarising of said material.

A step to apply a preload by elongation of the dielectric layer may also be included, prior to the depositing of the first electrode, as well as a step to adjust the preload after the polarising of the first or second electret.

The method according to the invention may use a dielectric layer in the form of a strip whose zones undergo simultaneously the different steps of the manufacturing method.

At the end of the manufacturing method, the strip thus obtained may for example be wound around itself to form a multi-layer variable capacitance system.

BRIEF DESCRIPTION OF THE DRAWINGS

The present invention will be more clearly understood with the aid of the following description and the appended drawings in which:

FIG. 1 is a side view of an embodiment of a variable capacitance system according to the present invention in a non deformed state, FIG. 1' is a detailed view of the system of FIG. 1, FIG. 1" is a detailed view of one variant of the system of FIG. 1.

DETAILED DESCRIPTION OF SPECIFIC EMBODIMENTS

Figure 2:
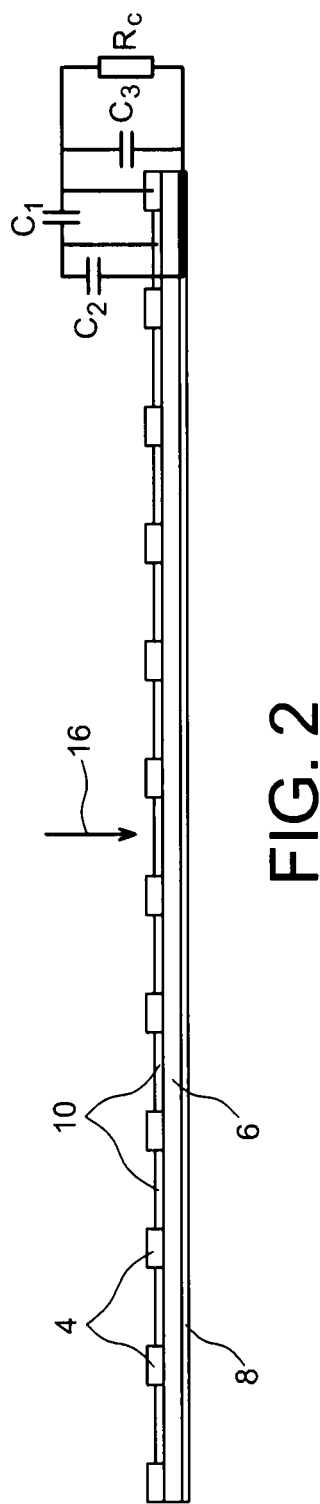
FIG. 2 is a side view of the system of FIG. 1 in a deformed state.

FIGS. 1 and 2 show an embodiment of a variable capacitance system 2 according to the present invention in a non deformed state and in a deformed state respectively.

The system 2 according to the present invention comprises a first electrode 4 forming a layer with cut outs deposited on a layer of dielectric material 6, wherein a second electrode 8 forms a continuous layer plane and an electret 10 located on or in the dielectric material inside the slots 12 in the first electrode 4.

The dielectric layer 6 is elastically deformable. For example, it may be made of dielectric polymers of type VHB®.

The material forming the dielectric layer is generally not or hardly compressible. This low degree of compressibility or absence of compressibility advantageously permits an increase in the surface area to be associated to a reduction in thickness, and inversely to a reduction in the surface area to an increase in thickness, and thus to obtain an enhanced effect of the value of the electric capacitance. Indeed, the capacitance is proportional to the surface area/thickness ratio. Consequently, an increase in the surface area and a reduction of the thickness causes a strong increase in the capacitance. Similarly, a reduction of the surface area implies an increase in the thickness and, consequently a considerable reduction of the capacitance. However a dielectric with notable compressibility remains within the scope of the present invention, for example in the case of a dielectric containing gas bubbles.

The second electrode 8 is able to follow the deformations of the dielectric layer without losing its properties of electrical conductivity, it may therefore be made from a electrically conductive elastically deformable material at least in its plane or have a structure which deforms at least in its plane. The second electrode may be made of copper, silver, gold, silver grease, carbon powder, conductive polymer or by implantation of ions on the surface layer of the polymer, as described in the document "Electroactive Polymer Actuators and Devices" (EAPAD) 2008, edited by Yoseph Bar-Cohen, Proc. of SPIE Vol. 6927 69270W-1).

When the second electrode is made of copper, gold or silver, a spring type structure may be used, examples of which are shown in FIGS. 3A to 3E, and will be described in detail in the following description.

The first electrode 4 with cut outs has a structure such that it is able to deform in at least one direction in the space so that it may follow the deformations of the dielectric layer 6, without losing its electrical conductivity properties.

The electret 10 is located inside the slots 12 in the first electrode.

The electret 10 may either:

fill the slots 12 and come into contact with the first electrode 4. In this case, the electret is able to deform elastically to follow the deformations of the dielectric layer, be deposited in a central zone of the slots 12 so that it is substantially at an equal distance from the edges of the slot, in this case the electret may be rigid as it only has a punctual location, and undergoes little or no deformation.

The electret may be implemented in different ways.

In the case of a solid electret, it is placed in the middle of the slots 12 relatively punctually to avoid the elongation/contraction of the dielectric layer 6.

In the case of a deformable electret, it is for example bonded onto the dielectric layer. An electret in loaded powder form deposited onto the dielectric layer may also be envisaged.

It may also be envisaged to polarise the zones of the free surface of the dielectric layer defined by the slots 12 of the first electrode 4, by direct polarising of the dielectric by ionisation, to form the electret directly inside the dielectric layer. This method has the advantage of not requiring the prior fixation of a material, its creation is thus simplified and quicker. Certain polymers, such as Teflon, are suitable for such a method for creating the electret by polarising.

The polarising methods may be of the corona type. For this method, an electrical arc may be created using a low current between a point and the dielectric, which has the effect of ionising the gas molecules separating the point and the dielectric and implanting them in the dielectric layer. It is also possible to accelerate the electrons supplied by an electron gun to the zones of the dielectric layer to be ionised. These polarising methods are very familiar to a person skilled in the art, and will not be described in detail.

By way of advantageous example, the dielectric layer may be made of VHB4910®, which is a deformable polymer with adhesive properties, wherein the fixation of a solid or powder form electret onto the dielectric layer is thus particularly simplified.

In the case of a powder form electret, it is possible:
to deposit the non polarised powder onto the polymer layer, for example parylene powder,
to polariser it directly thereafter onto the polymer using a classic method, of the corona discharge, electron acceleration or ion acceleration type.

The first electrode 4 forms with the electret a first capacitor COND1 with variable capacitance. The second electrode 8 forms with the electret 10 a second variable capacitance capacitor COND2.

In FIG. 1, les capacitors COND1 and COND2 are shown, the capacitance C1 represents the equivalent electrical capacitance between the set of conductive bars of the first electrode 4 and the electric charges of the electret, and C2 represents the total equivalent electrical capacitance between the second electrode 8 and the electric charges stored in the second electrode 8.

To simplify the explanation, we will use C1 and C2 to designate capacitances formed from simply one part of the first and second electrodes and the electret.

As may be seen in FIG. 1, the second electrode 8 forms with the electret 10 and the dielectric layer 6 a second capacitor designated COND2. The capacitance C2 of the second capacitor COND2 is determined by the distance between the second electrode 8 and the electret 10, which is equal to the thickness of the dielectric layer 6, and by the surfaces opposite the second electrode 8 and the electret 10.

A reminder is made that the capacitance of a capacitor is defined by:

$$C = \frac{\varepsilon_o \varepsilon_r S}{d} \quad (I)$$

Where $\varepsilon_o$: electrical permittivity of the vacuum,
$\varepsilon_r$: relative permittivity of the dielectric,
S: the surface area opposite the two plates of the capacitor,
d: the distance between the two plates.

In this description, the elongation of the dielectric layer is used to describe a deformation of the latter such that it causes a reduction of its thickness and an increase in its surface area in its mean plane. This elongation may be obtained, for example by applying an effort orthogonally to the mean plane of the dielectric layer in the direction of the layer, or by applying efforts, towards the exterior, on the exterior periphery in the mean plane of the dielectric layer. The elongation may also be a phase where it returns to a rest position, after a lateral compression or elongation phase according to the thickness.

By compression, it is meant an increase in the thickness of the dielectric layer and a reduction in its surface area in its mean plane. This compression may follow a deformation phase due to elongation, or may be obtained by applying an effort orthogonally to the mean plane of the layer moving away from the dielectric layer, or by compression by application of an effort.

When an elongation effort is applied to the system by applying an effort shown by the arrow 16 substantially orthogonally to the mean plane of the system, the dielectric layer 6 deforms, as its thickness reduces and its surface area increases, as shown in FIG. 2. The second electrode 8 and the electret follow the deformation of the dielectric layer 6. Consequently, the surfaces opposite increase, whilst the distance separating them reduces. Using the relationship I, an elongation of the dielectric layer causes an increase of the capacitance C2.

A reminder is made that the material of the dielectric layer 6 is not or hardly compressible. Therefore, the volume is conserved, i.e. an increase in the surface area with respect to the reduction of the thickness, and inversely during deformation.

When the system undergoes compression, for example during a return to a non deformed state after a phase of elongation, there is a reduction of the opposite surfaces and the distance between the second electrode 8 and the electret 10 increases, and the capacitance C2 decreases.

The capacitance of the second capacitor COND2 is thus variable.

Therefore in a elongation-compression cycle, a cycle of increase and reduction of the capacitance C2 of the second capacitor COND2 appears.

FIGS. 3A to 3E show different embodiments of the first electrode 4 comprising slots. The first electrode 4 is formed by a network of bars 18 which define deformable geometrical forms. The bars are stationary with respect to one another so that they form a lattice. Advantageously, the lattice is made in one piece by depositing a conductor, implanting ions onto the surface layer of the dielectric, etching or cutting out a conductive surface.

This lattice creation is especially advantageous, as it offers a large number of interconnections. By means of this structure, the breakage of an interconnection only causes local failure.

However, an electrode formed by a plurality of parallel and non interconnected zigzag rows is also within the scope of the present invention.

FIG. 1' shows an enlarged view of the first electrode 4 and the electret 10, more particularly two bars 18', 18" separated by the electret 10 may be seen.

The first electrode 4 and the electret 10 also form a first capacitor COND1. On the contrary, on the second capacitor COND2, the surfaces opposite the capacitor are not horizontal as shown in FIG. 1, but are vertical. As may be seen in FIG. 1', the face 20 opposite the first electrode 4 is borne by a lateral face of the bar 18', wherein the face 22 of the electret opposite the face 20 is formed by a vertical section of the electret. It is considered that the face 22 of the electret is located in the middle of half of the electret surface on the bar 18' side. This hypothesis applies in the case of an electret which fills the slot 12. The middle of the half corresponds to the mean distance of the charges of one of the two electrodes 18' or 18" if the electret extends across the entire inter-electrode space and has a homogeneous charge density across this entire width.

In the case of a punctual electret, it is preferably placed in the middle of the two electrodes.

Therefore for a distance L between the bars 18', 18", the distance between the plates of the first capacitor COND1 is L/4.

Each bar 18 has two faces, each forming a plate of a capacitor.

When the dielectric layer 6 is elongated, the distance between two bars 18', 18" increases, as may be seen in FIG. 2. Consequently the distance between the two opposite faces increases. However, the opposite surfaces are not modified, as when the thicknesses of the electret and the first electrode decrease, their depths (not visible) increase. Taking the relationship (I), during an elongation, the capacitance C1 of the first capacitor COND1 decreases, whereas during a compression, it increases.

The change in the capacitances C1, C2 of the capacitors COND1, COND2 may be resumed respectively as follows:

|  | C1 | C2 |
|---|---|---|
| Elongation | ↓ | ↑ |
| Compression | ↑ | ↓ |

Consequently, during the deformation of the system the capacitances of the capacitors COND1 and COND2 vary inversely.

The relationship between the charge and the capacitance is as follows:

$$Q = C \times V \quad (II)$$

Q: charge of the capacitor,
C: capacitance of the capacitor,
V: voltage at the terminals of the capacitor.

When the system is elongated, there is an increase in the capacitance C2 and a reduction in the capacitance C1.

If the voltage $V_C$, at the terminals of the first and the second electrode is constant, then the charge $Q_2$ increases when $C_2$ increases and the charge $Q_1$ decreases when $C_1$ decreases, and inversely.

This opposite variation of the capacitances C1 and C2, thus causes a variation in the charge between the first and the second electrode, which leads to a redistribution of the electric charges between the upper and lower electrodes via a charge resistor Rc which connects the first electrode 4 and the second electrode 8. There is consequently a production of electrical energy. The charge resistor $R_C$ may be a battery or a user device directly.

FIG. 1 also shows a third capacitor COND3 of capacitance C3 formed between the first electrode 4 and the second electrode 8, which is electrically connected in parallel to the capacitors COND1 and COND2.

It is preferable that this capacitance C3 has a negligible value compared to C1 and C2 to avoid limiting the limiter voltage level and the output power. To achieve this, it may be provided for example to reduce the surfaces opposite the electrodes 4, 8. This is achieved, for example by minimising the width of the bars of the first electrode and/or by forming the second electrode so that it is only partially opposite the bars of the first electrode. This structure is however such that it ensures electrical continuity throughout the second electrode. For example, FIG. 1" shows a detail of a system according to the invention in which the second electrode 8' is structured so that its surface opposite the first electrode is reduced. The zones 8.1' of the second electrode 8' positioned opposite the first electrode are omitted. It may therefore be envisaged to create a second electrode whose structure is substantially "a negative" of the structure of the first electrode whilst ensuring the electrical continuity.

In the example shown, the first electrode has a plurality of slots, but an electrode with only one slot is within the scope of the present invention. However a large number of slots permits a large number of first capacitors to be formed, and thus to increase the quantity of energy converted. It is advantageous for the width of the slots to be similar to the thickness of the dielectric, so the width of the slots is lower than the thickness in a compressed situation and the width of the slots is greater than the thickness in an elongated situation, so that the electret preferably influences the electrode 4 in the compressed position, than the electrode 8 in the elongated position.

Furthermore, the example shown comprises slots whose edges are substantially orthogonal to the dielectric layer, however it is obvious that slots with angled edges are also within the scope of present invention.

The dielectric layer is for example a polymer of the type VHB4910®. The electrodes may be made of copper, silver, silver grease, carbon powder, gold . . . the electret may be based on parylene, Teflon or Kapton® into which electric charges have been injected, using known techniques as previously described.

We will now describe more particularly the embodiments of the first electrode with cut outs shown in FIGS. 3A to 3E.

In general, it is sought to create a first electrode which has slots with substantially constant sizes and shapes so that the electrostatic efforts are substantially homogeneous on the entire surface of the electrode. Furthermore, forms are sought which do not oppose the deformation of the dielectric layer. Consequently, an electrode structure is sought which deforms considerably (>1%) without causing significant deformation of the material itself, i.e. whose modification of form is preferably obtained by deflection of the different parts of the structure and not by compression/elongation of the material itself. This is especially the case when the electrode material is not very suited to deformation, for example when the bars of the first electrode are made from metallic conductive materials. Finally, it is preferable for the connections between bars to be quite numerous to ensure good electrical continuity.

Figure 3A:
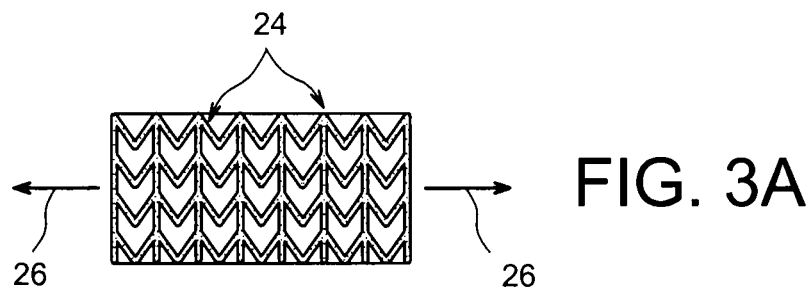
FIGS. 3A to 3E are embodiments, viewed from above, of the electrode with cut outs which may be implemented in the system according to the present invention.

FIG. 3A shows the bars in fir shapes 24 positioned next to one another and connected to one another at the ends of their branches. The bars are connected so that they ensure an electrical continuity across the entire surface of the electrode.

This electrode is deformable in the direction of the arrows 26. It elongates in the direction of the arrows 26, however it only deforms slightly in the direction orthogonal to the arrows 26.

This electrode structure has a large number of interconnections between bars, and homogeneousness in the form of the slots, the latter are all identical.

Figure 3B:
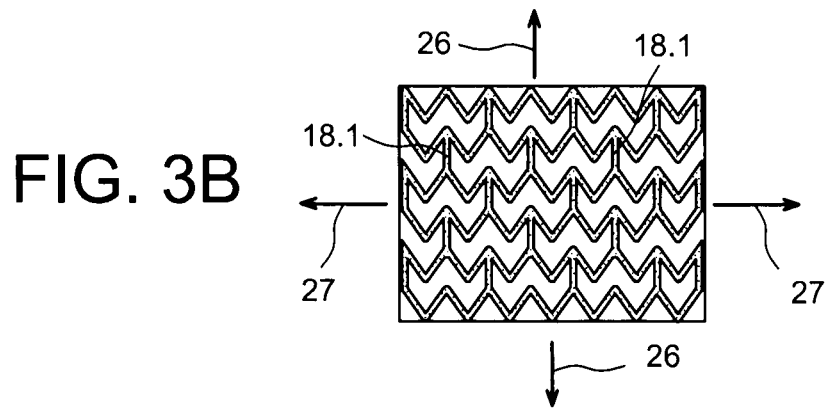

FIG. 3B shows the bars forming lines of zigzag patterns positioned in parallel to one another and connected to one another by transversal connection bars 18.1. Contrary to the structure of FIG. 3A, the transversal connection bars 18.1 between three successive lines of zigzag patterns are not aligned.

This electrode is deformable in the direction of the arrows 26. It elongates in the direction of the arrows 26, however it only deforms slightly in the direction 27 orthogonal to the arrows 26. It also has slots of the same form, so the electrostatic efforts are thus substantially homogeneous.

Figure 3C:
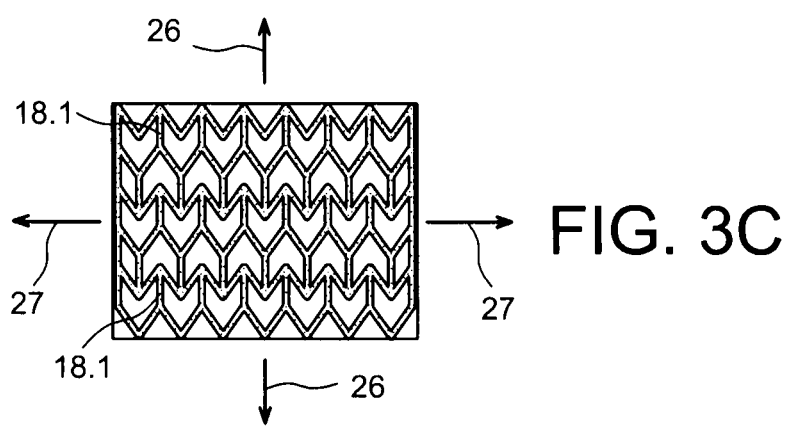

The structure of FIG. 3C is close to that of FIG. 3B. It differs from it in that transversal connection bars 18.1 are present at each zigzag pattern and offset by a pitch between two successive lines of zigzag patterns.

This electrode has different forms of slots. However, it has a high density of connections between bars, which permits good electrical continuity.

This structure essentially deforms in the direction of the arrows 26.

Figure 3D:
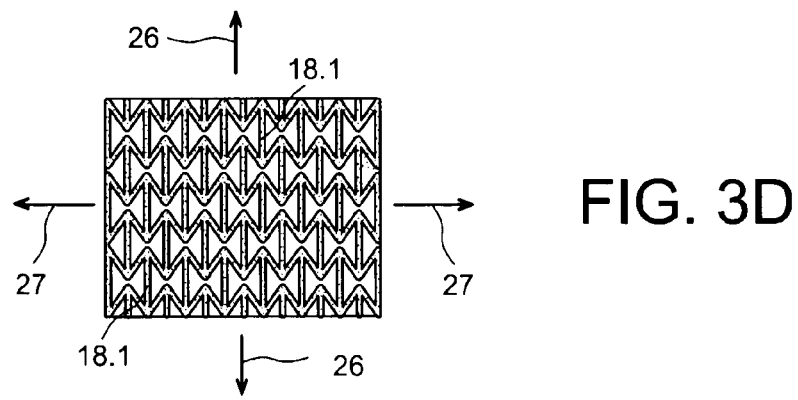

The structure of FIG. 3D has the advantage of deforming in the direction of the arrows 26 and simultaneously in that of the arrows 27. Indeed, an elongation of the dielectric layer in a first direction also tends to cause an expansion in a direction orthogonal to the first direction contained in the plane of the flexible dielectric layer. This configuration allows the variations in capacitance to be maximised and thus the quantity of energy that may be recuperated for a given amplitude of elongation.

The structure of FIG. 3D comprises lines of zigzag patterns, wherein the zigzag patterns of two successive lines are opposed two by two. Transversal connection bars 18.1 are provided between the points of two zigzag patterns of two successive lines, and the zigzag patterns connected are those whose points are the furthest apart.

Figure 3E:
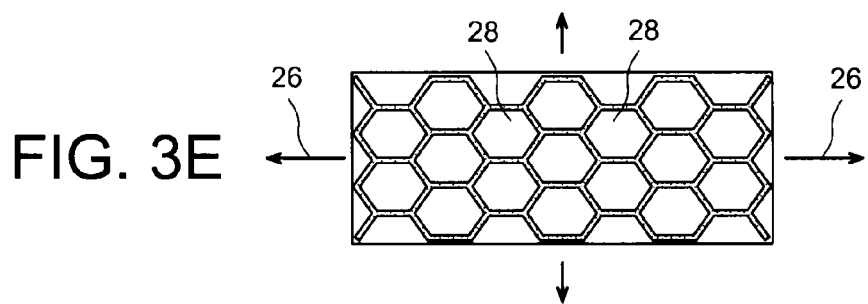

The structure of FIG. 3E has a layout of the bars such that they define honeycomb shapes 28. This structure has the advantage of allowing the use of more rigid electrets positioned punctually in the centre of the slots, as the slots have a form which offers a more homogeneous distance between the bars of a slot and a central zone of the slot than the other structures.

It is obvious that other electrode structures are also suitable.

Figure 5:
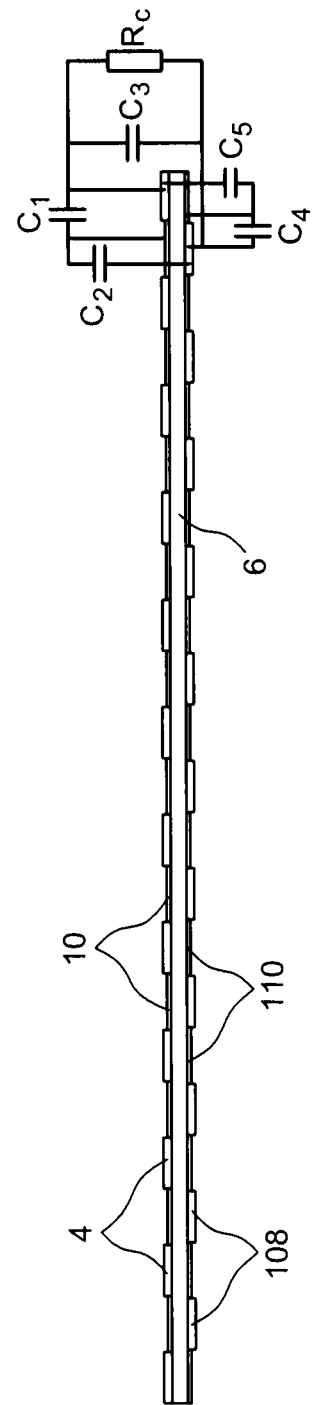
FIG. 5 is a side view of the system of FIG. 4 in a deformed state.
Figure 4:
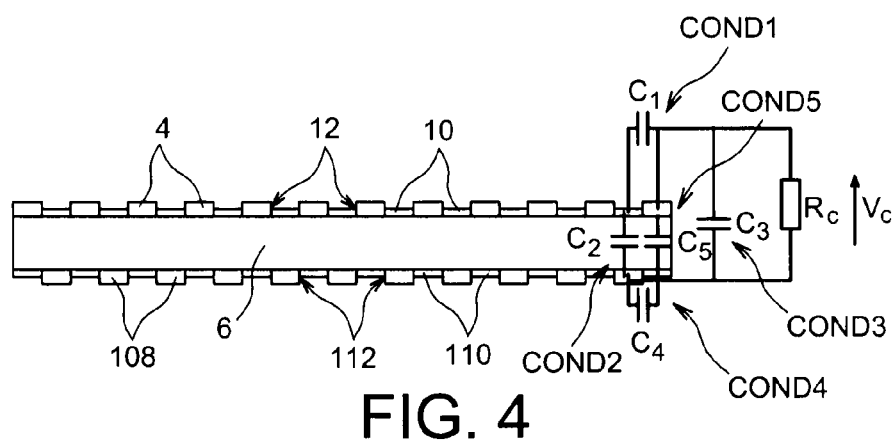
FIG. 4 is a side view of a system according to the invention comprising two electrets with opposite charges, wherein the system is in a non deformed state.

FIGS. 4 and 5 show a variant of a variable capacitance system according to the present invention comprising both a first electret 10 on the side of the first electrode 4 and a second electret 110 on the side of the second electrode 108.

We will describe this variant in detail.

The first electrode is similar to that of the system of FIG. 1. However the second electrode 108 has a structure with cut outs that are deformable at least in its plane, similar to that of FIG. 1, wherein a second electret 110 is located in each slot 112 of the second electrode 108.

The first electret 10 and the second electret 110 have opposite charges. For example, if the first electret 10 is negatively charged, the second electret 110 is positively charged. The first electret and the second electret 110 may be made from the same material.

The system of FIG. 4 or 5 comprises a first capacitor COND1 of capacitance C1 between the first electret 10 and the first electrode 4, a second capacitor COND2 of capacitance C2 between the first electret 10 and the second electrode 108, a third capacitor COND3 of capacitance C3 between the first 4 and the second electrode 108, a fourth capacitor COND4 of capacitance C4 between the second electrode 108 and the second electret 110 and a fifth capacitor COND5 of capacitance C5 between the first electrode 4 and the second electret 110.

The second electret 110 is deposited on the dielectric layer 6 or in the dielectric layer 6, in the slots 112 of the second electrode 108 similarly to the first electret 10.

We will now explain the behaviour of the different capacitances in function of the type of deformation undergone by the dielectric layer 6.

During an elongation of the dielectric layer 6, similar to the system of FIG. 1, C1 decreases as the distance between the first electret 10 and the first electrode 4 increases. The behaviour of the fourth capacitor COND4 is identical to that of the first capacitor COND1, the capacitance C4 also decreases. As concerns the capacitance C2 of the second capacitor, it increases, as well as that C5 of the fifth capacitor C5, as they are directly proportional to the thickness and the surface area of the dielectric layer 6.

In the initial state, the first electrode 4 is initially subjected to the influence of the first electret 10 which is located in the slots 12. During the elongation, the first electrode 4 is increasingly less subjected to the influence of the first electret 10, and increasingly more subjected to the influence of the second electret 110. This change of influence also occurs for the second electrode 108, which is initially under the influence of the second electret 110, then progressively subjected to the influence of the first electret 10.

This change of influence thus causes a redistribution of the electric charges on the first 4 and second 108 electrodes, via a charge resistor $R_C$ between the two electrodes 4, 108 and the third capacitor COND3.

As in the system of FIG. 1, it is advantageous to reduce the capacitance C3 of the third capacitor COND3. This may be particularly easy in this case, as the second electrode has cut outs and this allows the surfaces of the first 4 and second 108 electrode to be offset to reduce the opposite surfaces.

In the case of a compression, the change in the capacitances is inverted.

The following table shows the changes in capacitances C1, C2, C3, C4, C5 of the capacitors COND1, COND2, COND3, COND4, COND5 respectively:

|  | C1 | C2 | C3 | C4 |
| --- | --- | --- | --- | --- |
| Elongation | ↓ | ↑ | ↑ | ↓ |
| Compression | ↑ | ↓ | ↓ | ↑ |

This variant permits a quantity of energy to be recuperated that is greater than that recuperated in the system of FIG. 1, as the energy for moving the charges of the two electrets is converted.

Figure 6:
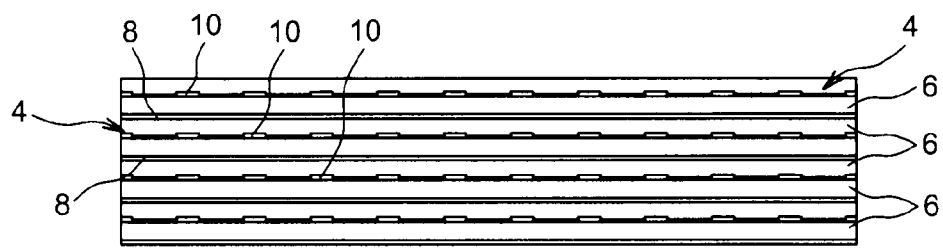
FIG. 6 is a side view of a multi-layer system according to the invention based on the system of FIG. 1, FIG. 6' is a side view of a multi-layer system according to the invention based on the system of FIG. 4.
Figure 6:
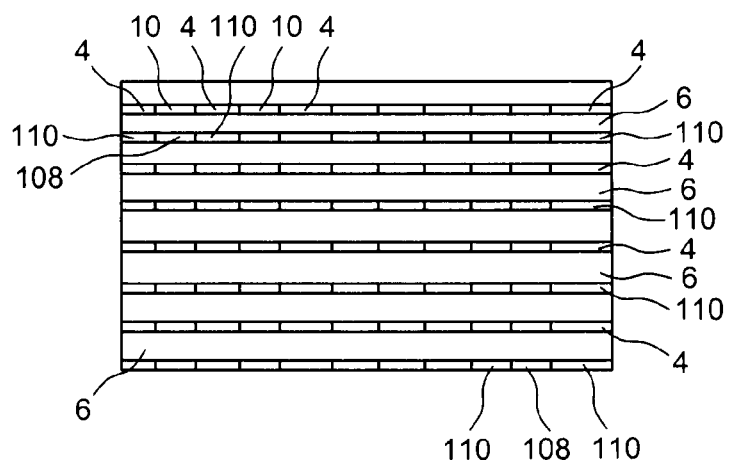

FIG. 6 shows an embodiment of a multi-layer system obtained by the superposition of systems according to FIG. 1. In this stack, the first 4 and second 8 electrode opposite one another are separated by a dielectric layer 6.

This superposed structure permits the energy recuperated to be increased.

In the example shown, the electret zones are aligned, but this layout is in no way restrictive. In the case of the system of FIGS. 4 and 5 in which electrets are laid out on the two faces of the dielectric, it is however preferable, in the case of a multi-layer system, to superpose the electrets zones of a layer with the electrodes of another layer, as is shown in FIG. 6'.

We will now provide, by way of example the calculation of a power that may be recuperated by a system similar to that of FIG. 1.

We consider that a system in which the dielectric layer 6 is made of VHB4910®, whose relative permittivity $\in_r$ is equal to 4.8. In the rest state, the dielectric layer 6 has a thickness $e_0=50$ μm and a surface area $S_0=1$ cm$^2$.

Figure 7:
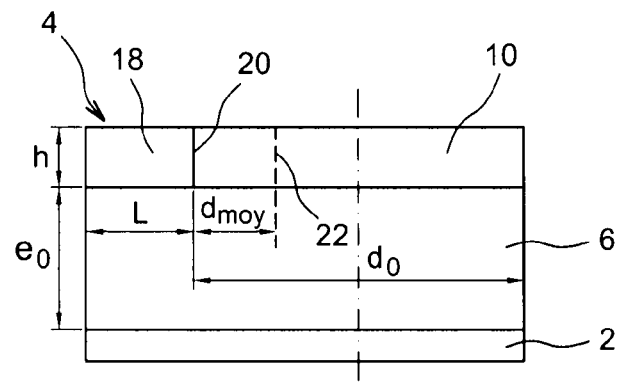
FIG. 7 is a simplified representation of a system according to the invention.

For the calculation, we consider that the first electrode 4 has a bar 18 and an electret 10 as in FIG. 7, which corresponds to an elementary pattern. The length of the electret is $d_0=20$ μm, the width of the bar 18 is equal to L=5 μm and the height of the bar 18 is equal to h=5 μm.

It is considered that the bar 18 and the electret 10 have the same thickness. Furthermore, it is considered that the face 22 of the electret forming the plate of the second capacitor is positioned in the middle of the half of the electret surface, i.e. the mean distance of the charges from one of the bars of the electrode 18, therefore at a distance of 5 μm from the face 22.

Furthermore, the surface of the first electrode 4 represents $1/5^{th}$ of the surface area S0 and the surface area of the electret 10 represents $4/5^{th}$ of the surface area S0.

We will calculate the values of the electric capacitances C1, C2 and C3 before elongation, noted $C_{10}$, $C_{20}$, $C_{30}$ respectively:

$$C_{10} = \frac{\varepsilon_0 \varepsilon_r S_{lateralupperElectrode}}{d_{mean0}} = \frac{\varepsilon_0 \varepsilon_r \frac{2}{5} cm^2}{d_{mean}} = \frac{8.84 \cdot 10^{-12} \cdot 4.8 \cdot \frac{2}{5} \cdot 10^{-4}}{5 \cdot 10^{-6}} = 339 \text{ pF}$$

($d_{mean}$ represents the mean distance of the charges from the electret with respect to the upper electrode.)

$$C_{20} = \frac{\varepsilon_0 \varepsilon_4 S_{electret0}}{e_0} = \frac{\varepsilon_0 \varepsilon_r \frac{4}{5} \cdot 10^{-4}}{50 \cdot 10^{-6}} = 68 \text{ pF}$$

$$C_{30} = \frac{\varepsilon_0 \varepsilon_r S_{upperelectrode}}{e_0} = \frac{\varepsilon_0 \varepsilon_r \frac{1}{5} \cdot 10^{-4}}{50 \cdot 10^{-6}} = 17 \text{ pF}$$

We will now calculate the values of the electric capacitances after elongation, noted $C_{11}$, $C_{21}$, $C_{31}$ respectively. We will consider an elongation of a factor 2 and a constant volume, i.e. the thickness of the dielectric layer is halved whereas the surface area of the dielectric layer is doubled:

$$C_{11} = \frac{\varepsilon_0 \varepsilon_r S_{lateralupprElectrod}}{d_{mean1}} = \frac{\varepsilon_0 \varepsilon_r \frac{2}{5} \cdot 10^{-4}}{10 \cdot 10^{-6}} = 170 \text{ pF}$$

$$C_{21} = \frac{\varepsilon_0 \varepsilon_r S_{electre1}}{e_1} = \frac{\varepsilon_0 \varepsilon_r 2 \cdot \frac{4}{5} \cdot 10^{-4}}{25 \cdot 10^{-6}} = 272 \text{ pF}$$

$$C_{31} = \frac{e_0}{e_1} C_{30} = 34 \text{ pF}$$

(it is considered that the surface of the upperelectrode does not change)

Which is to say a negative charge $Q_0$ is stored in the electret 10 such that the electrical champ does not exceed $E_0=100$ V/µm in the dielectric layer 6 to avoid any dielectric breakdown. In the initial position, the potential of the electret 10 at the distance $d_{mean0}$ of the first electrode 4 is then equal to $V_0=V_{20}=-V_{10}=-d_{mean0} E_0=-500$ V (it is considered that $V_{30}=0V$, discharged output), therefore $E_0=100$ V/µm.

It has been shown that it was possible to create an electrical field of 204 V/µm with an electret, for example in the document "Parylene HT based electret rotor generator", MEMS 2008, Tucson, Ariz., USA, Jan. 13-17, 2008, p 984-987. The choice of an electrical field of 100 V/µm is therefore soundly based.

The distribution of the electric charges in the initial position is as follows:

$$Q_0 = (C_{10}+C_{20})V_0 = -203 nC$$

$$Q_{10} = C_{10}V_{10} = -C_{10}V_0 = 169 nC$$

$$Q_{20} = C_{20}V_0 = -34 nC$$

$$Q_{30} = 0 nC$$

We will now calculate the gain in potential electrical energy following the deformation of the dielectric layer with, during the deformation, nil consumption; i.e. $R_c$=infinite. The electrical circuit is thus formed of three capacitors in series, the circulation of an electric current in the circuit thus causes the same variation of electric charge in each of the capacitors. The system may then be described by the following system of equation:

$$\begin{cases} -\Delta Q_1 = -\Delta Q_2 = \Delta Q_3 \text{ where } \begin{vmatrix} \Delta Q_1 = C_{11}V_{11} - Q_{10} \\ \Delta Q_2 = C_{21}V_{21} - Q_{20} \\ \Delta Q_3 = C_{31}V_{31} - Q_{30} \end{vmatrix} \\ V_{31} = V_{21} + V_{11} \end{cases}$$

$$\begin{cases} V_{21} = \frac{C_{11}Q_{20} + C_{11}Q_{30} + C_{31}Q_{20} - C_{31}Q_{10}}{C_{11}C_{21} + C_{11}C_{31} - C_{21}C_{31}} = -207 \text{ V} \\ V_{31} = \frac{C_{11}Q_{20} + C_{11}Q_{30} + C_{21}Q_{10} - C_{21}Q_{30}}{C_{11}C_{21} + C_{11}C_{31} + C_{21}C_{31}} = 658 \text{ V} \end{cases}$$

The equivalent capacitance $C_{eq}$ viewed by the charge $R_c$ corresponds to the capacitances C1 and C2 in series, both in parallel with C3, this is therefore equal to:

$$C_{eq} = \frac{C_{11}C_{21}}{C_{11}+C_{21}} + C_{31} = 138.6 \text{ pF}$$

The potential electrical energy $E_p$ available at the output of the system, following the deformation is thus equal to:

$$E_p = \frac{1}{2} C_{eq} V_{31}^2 = 30 \text{ µJ}.$$

If we consider a multi-layer system of 200 layers similar to that of FIG. 6, relating this energy to the volume of the dielectric layer used, we obtain a density of energy of 30 µJ*200 layers=6 mJ/cm$^3$.

It should be noted that an equivalent energy is recuperated during the return to the initial situation of the system. A complete cycle thus permits 12 mJ/cm$^3$ to be recuperated, for example, for an operating frequency of 1 Hz (corresponding for example approximately to the frequency of application of an effort on a shoe to walk), a power that may be recuperated of 12 mW/cm$^3$.

The variable capacitance system according to the present invention has been applied to energy recuperation, but it may also be used for an actuator. By means of the system according to the present invention, it is possible to create an actuator permitting both the elongation and the contraction of the dielectric layer, which is not the case of known actuators in which only the elongation may be favoured, the contraction only occurs by the internal strains of the dielectric layer.

Figure 8A:
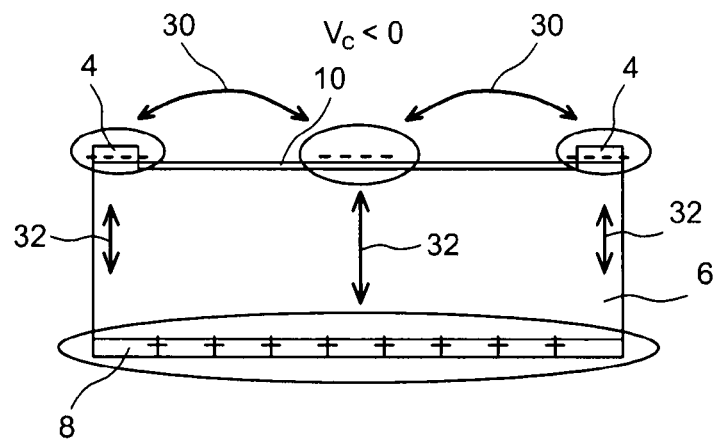
FIGS. 8A and 8B are diagrammatical representations in side view of a system according to the invention operating as an actuator.
Figure 8B:
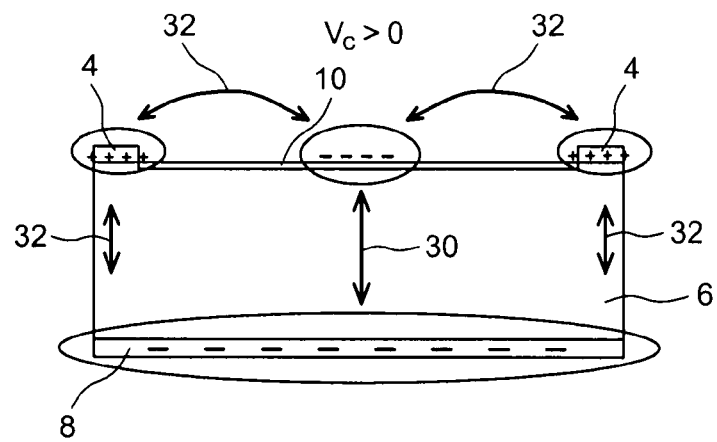

FIG. 8A shows diagrammatically an operation in elongation mode, and FIG. 8B shows diagrammatically an operation in compression mode. The mode of deformation depends on the sign of the control voltage $V_C$ between the first 4 and the second 8 electrode. The arrows symbolise interactions and not a specific type of interaction.

Let us consider an electret 10 that is polarised negatively.

When the control voltage $V_C$ is negative, the second electrode 8 is polarised positively and the first electrode 4 is polarised negatively. Consequently, as shown in FIG. 8A, there is repulsion between the electret and the first electrode 4 shown by the arrows 30, and attraction, shown by the arrows 32, between the electret 10 and the second electrode 8. The thickness of the dielectric layer 6 decreases and its surface area increases.

When the control voltage $V_C$ is positive, the second electrode 8 is polarised negatively and the first electrode 4 is polarised positively. Consequently, as shown in FIG. 8B, there is repulsion, shown by the arrows 30, between the electret 10 and the second electrode 8, causing an increase in the thickness of the dielectric layer 6. There is attraction, shown by the arrows 32, between the electret 10 and the first electrode 4, causing a reduction of the surface area of the dielectric layer 6.

It should be noted that there is also the appearance of attraction efforts between the first 4 and second 8 electrodes, these efforts are opposed with the compression effect sought. However, by minimising the capacitance C3 between the first electrode 4 and the second electrode 8, for example by minimising the width of the bars, then this attraction effect may be considered as negligible with respect to the other electrostatic efforts.

It should be noted that the thickness of a system according to the invention is sufficiently thin for the deformations caused by the attraction and repulsion efforts between the electret and the first electrode to be distributed homogeneously throughout the thickness of the system. Furthermore, as concerns the deformations caused by the attraction and repulsion efforts between the electret and the second electrode, they appear throughout the system. There is thus indeed an increase or a reduction in the thickness that is uniformly distributed.

The energy conversion system that may be created using this invention presents the advantage of no longer requiring specific means to polarise the structure at each cycle to carry out energy recuperation cycles, due to the use of the electret. This allows the system to be simplified as the transfer electronics of the electric charge to the electrostatic structure may be eliminated. Furthermore, it is no longer necessary to have minimum energy and to detect the maximum capacitance. The electrical losses caused by these electronics are therefore eliminated.

Moreover, the system according to the present invention has the advantage of permitting energy to be recuperated both during the elongation period and during the release period. The systems of the prior art, only permitted recuperation during the release period.

This recuperation during these two phases has advantage of disposing of electrical energy from the elongation of the dielectric layer. This rapid generation of energy is particularly advantageous in the case of a switch or a wireless remote control, as the switch or the remote control uses the energy produced by the elongation of the dielectric layer to send the command before the user releases the pressure on the switch or the remote control button. Consequently, there is no need to provide means to store energy to send the command, it is immediately available, contrary to the devices of the state of the prior art in which the energy is only recuperated when the dielectric layer is released.

This is also particularly advantageous for any sensors using deformation to detect and to measure a physical measurable quantities, for example a pressure or deformation sensor. A pressure sensor, comprising a system for generating electrical energy according to the present invention, is self-powered as it is the deformation of the dielectric layer which generates the electrical energy, and also permits the value of the pressure detected by the sensor to be identified before it is removed, i.e. before the end of the elongation of the dielectric layer.

Furthermore, in the case of a switch or a remote control, the elongation of the dielectric layer is imposed by the user, consequently the energy recuperation is not commanded by the behaviour of the dielectric layer during its return to a contracted position, it is therefore potentially more efficient and more rapid.

Figure 9:
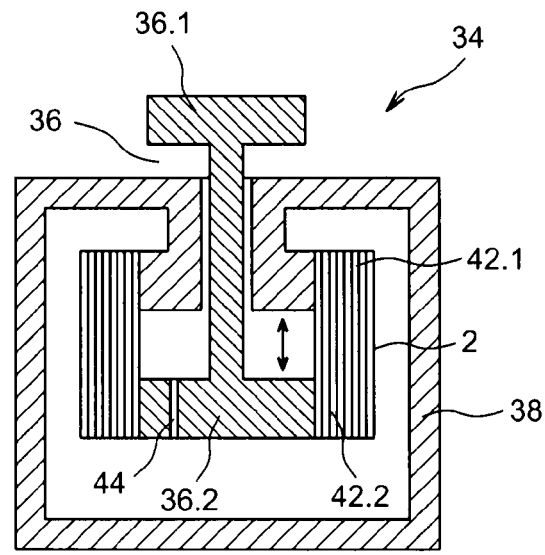
FIG. 9 is a diagrammatical representation of a switch implementing a system according to the present invention.

FIG. 9 shows an embodiment of a switch 34 according to the present invention comprising a variable capacitance system 2 according to the invention.

The system 2 according to the invention is made from a strip similar to that of FIG. 1 or FIG. 4, wound around itself so that it forms a multi-layer system in the form of a coil.

The switch comprises a push button 36 mounted so that it is axially mobile in a support 38. The push button has an end 36.1 designed to act as an interface for the user and a second end 36.2 stationary in movement to the system 2 and designed to cause the deformation of the system 2. The system 2 is fixed by a first longitudinal end 42.1 to the support 38 and by a second longitudinal end 42.2 to the piston 36.

An air passage 44 is fitted in the piston 36.2 to avoid the appearance of excess pressure in the system 2.

When the operator presses the push button, the second end 36.2 of the push button 36 slides downwards, as shown in FIG. 9, causing an elongation of the system and a reduction of the capacitances C1 and an increase of the capacitances C2, there is conversion of the mechanical energy used to move the push button into electrical energy, wherein this energy is directly available for the command associated to the switch. When the effort on the push button 36 is released, the capacitances C1 decrease and the capacitances C2 increase, also causing a conversion of mechanical energy into electrical energy.

Figure 10A:
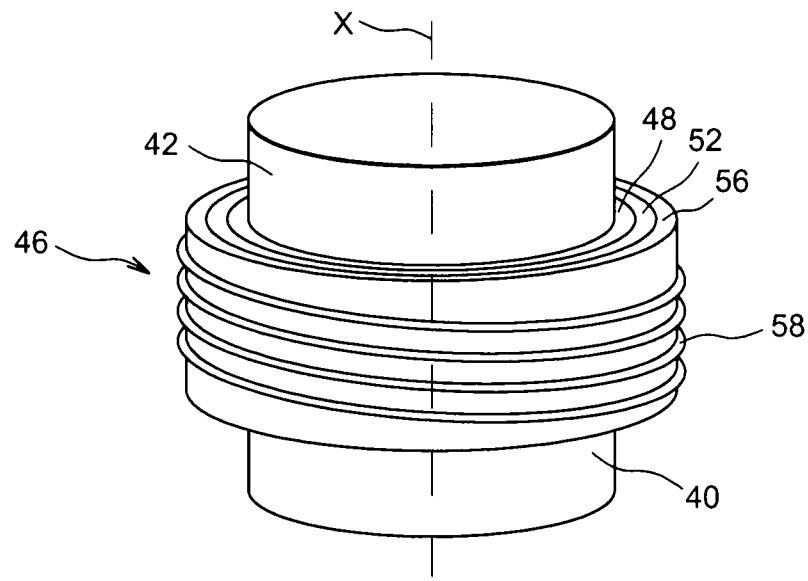
FIG. 10A is a perspective view of a device incorporating a variable capacitance system according to the present invention according to another embodiment.
Figure 10B:
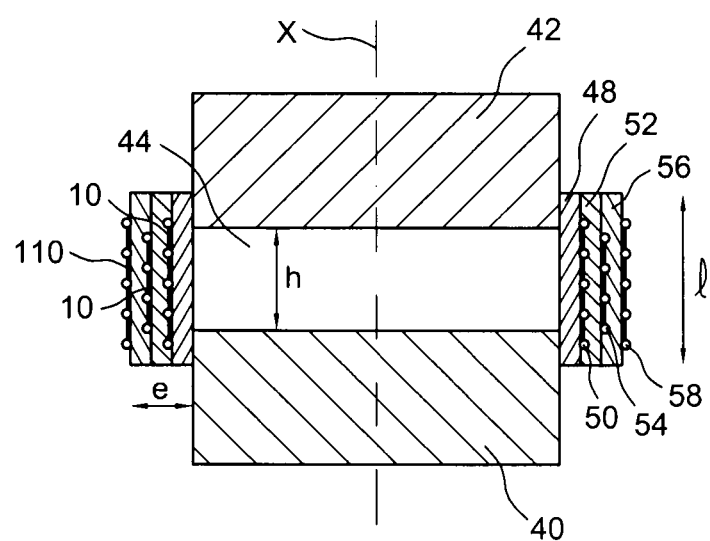
FIG. 10B is a longitudinal cross sectional view of the device of FIG. 10A.

FIGS. 10A and 10B show another embodiment of a variable capacitance system according to the present invention integrated into an energy recuperation device.

This device comprises a first support 40 with an X axis cylindrical form and a second support 42 suspended above the support 40 along the X axis. The first support 40 and the second support 42 are preferably rigid, so that the energy is mainly used for the deformation of the layers forming the capacitors.

The second support 42 has a cylindrical form and an X axis, whose cross section has dimensions similar to those of the support 40.

An empty space 44 of height h is positioned between the upper face of the support 40 and the lower face of the second support 42. Obviously, the adjectives "upper" and "lower" are not restrictive and it is possible for the X axis to be horizontal and the two faces would then be at the same height.

The device comprises a sleeve 46 connecting the first 40 and the second 42 support holding it away from the support 40. The sleeve 46 forms a lateral wall for the empty space 44. The sleeve has a height 1 and a radial thickness e.

In the example shown, the sleeve 46 has a radially interior first layer 48 made of elastically deformable material, more particularly elongatable in the direction of the X axis, an electrically conductive wire 50 wound around the first layer 48 and forming a helical shape substantially on the height of the empty space 44, a second layer 52 around the wire 50 in elastically deformable dielectric material, more particularly elongatable in the direction of the X axis, a second electrically conductive wire 54 wound helically around the second layer 52 substantially on the height of the empty space 44, a third layer 56 made of elastically deformable dielectric material, more particularly elongatable in the direction of the X axis, and a third electrically conductive wire 58 wound helically around the third layer 56 substantially on the height of the empty space 44.

Moreover, the wires 50, 54, 58 are offset along the X axis so that the turns formed by two directly adjacent films are not superposed considered from any radial direction.

The wires 50, 54, 58 are connected electrically to permit the recuperation of the charges generated.

Furthermore, the device comprises an electret material 10, between the turns of the wires 50 and 58, and an electret material 110 of opposite polarity to that of the electret 10 between the turns of the wire 54. The materials 10, 110 are for example deposited on the dielectric layers. More generally, the sleeve has alternate layers of electrets of opposite polarities.

The assemblies formed by the turns, the electrically insulating layers and the electrets form variable capacitance capacitors, wherein the turns form the electrodes.

The polarising is applied by the electrets 10, 110. The variable capacitance system is very close to that of FIG. 4, the electrodes with cut outs are replaced by the turns.

The capacitances of the capacitors vary when an effort is applied along the X axis in the direction of the arrow F, for example a traction effort.

The first layer 48 fixes the first wire 50 onto the support and the suspended element, it is thus not used as a dielectric in a capacitor.

The layer 48 and the layers 52 and 56 may be made of a polymer.

The operation is identical to that previously described for FIGS. 4 and 5, and will not be described in detail.

It may be envisaged to replace one of the wound wire electrodes by a continuous layer of electrically conductive material, this structure is then similar to that of FIG. 1. It may also be envisaged to alternate the wound wire electrodes with layer electrodes.

Of course the number of electrodes is not restrictive.

Advantageously, the layers and the wires are bonded.

In the case where a device is to be created with a large number of layers, advantageously a rigid film may be inserted between pairs of layers. This film is positioned at the zones where the sleeve fits into the first and the second support, i.e. the zones of the layers positioned on either side of the empty space 44. The presence of this film does not hinder the deformation of the layers and turns in the empty space. The insertion of these films ensures that the deformation is more homogeneous throughout the thickness of the layers, wherein this thickness extends radially.

It may be provided for example to superpose 50 layers between which are positioned wound wires.

By way of example, the height of the empty space is 3 mm, the height of the sleeve is 20 mm and the thickness of the sleeve is 250 μm.

This device is very efficient, simpler to create as the electrodes may be formed by simple wound wires, and the turns do not oppose the elongation. Furthermore, the turns hold the dielectric in shape in the radial direction.

Obviously there may be any number of dielectric layers and wound wires. Moreover, the tubular form is not restrictive either, for example the sleeve may have an elliptical cross section. Furthermore, the supports 40 and 42 may be connected by a mechanical guide, a slide for example, ensuring a relative movement according to the X axis of the two sleeves. These supports may be hollow or not, only the outside surface is important (tubular form for example).

For example, the device of FIGS. 10A and 10B may be made according to the following method:

1—positioning of the supports 40 and 42 at a first distance h1 from each other, 2—winding of a first elongatable layer 48 around the supports 40, 42, 3—winding of a conductive wire 50 for n turns so as to cover the air gap space h1, 4—depositing an electret 10 between the turns of the conductive wire, 5—covering by an elongatable dielectric layer 52, 6—covering by a solid elongatable electrode, for example a conductive polymer, or by n turns of a conductive wire 54 in staggered rows with respect to the conductive wire 50 of the previous layer and of which the gaps are filled with an electret 110 of opposite polarity, 7—covering by a elongatable dielectric layer 56, 8—steps 3 to 7 are repeated until the number of layers desired is reached (or the desired mechanical rigidity), 9—finally, the sleeve is preloaded, by applying a mechanical strain imposing a minimum air gap distance h2 greater than h1 to ensure a minimum voltage on the polymer, Advantageously, the layers are bonded to one another.

The device operates between the position h2 and a position h3>h2, wherein the device permits this relative movement to be converted into electrical energy It may be provided, after the installation of the first elongatable layer 48 and after the installation of each elongatable dielectric layer, to wind a non elongatable film onto the upper and lower zones where the sleeve joins the supports 40, 42.

We will now describe an example of a manufacturing method for a variable capacitance system according to the present invention.

Figure 11:
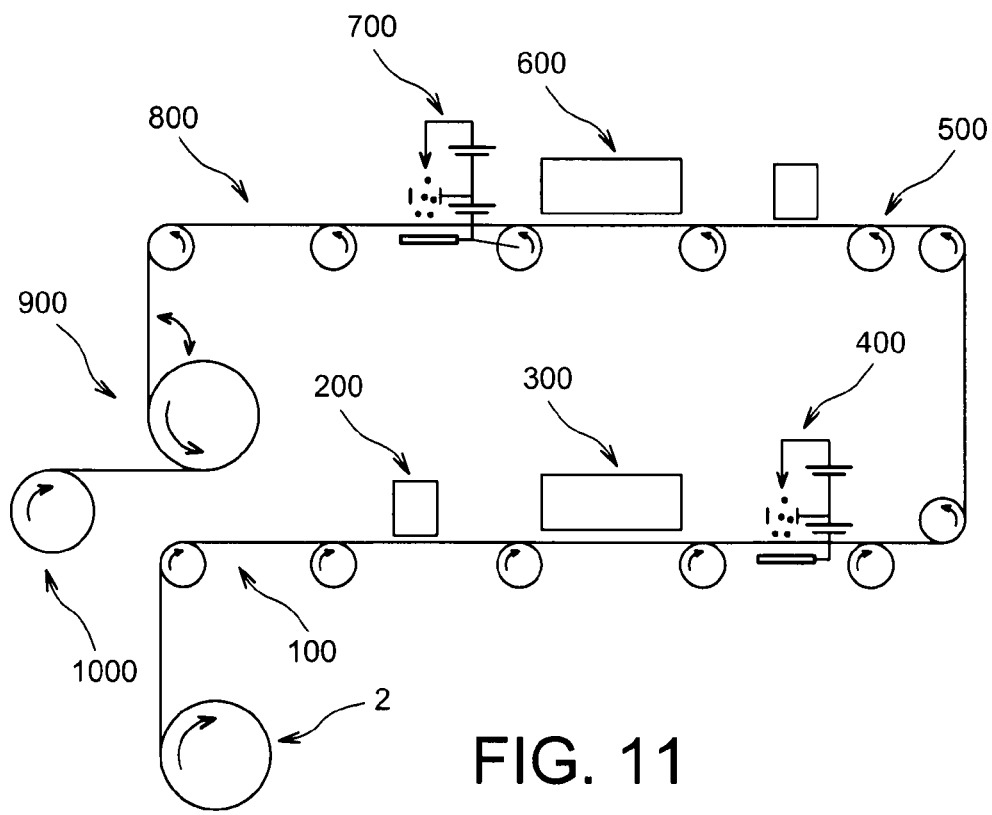
FIG. 11 is a diagrammatical representation of an embodiment of a method for creating a system according to the present invention.

FIG. 11 shows an example of a representation of the fabrication of a system according to the present invention in the form of a production line.

We start with the dielectric in the form of a wound strip.

In a step 100, the dielectric is shaped, for example by applying a surface elongation preload, so as to create an elastic recoil force inside it to facilitate the return of the system to its initial form.

In a step 200, the first electrode 4 with cut outs is deposited on a face of the dielectric, for example by lithography.

In a step 300, the base material of the electret 10 is deposited, this material is not charged, for example it may be Teflon or parylene, in the slots of the electrode 4, on the entire surface in the case of a deformable material, powder or elastic polymer type, or substantially in the centre of the slots in the case of a solid material.

In a step 400, the base material of the electret is polarised so as to form the electret, wherein this polarising is obtained by Corona discharge, by ionic blast, by electron acceleration or by ion acceleration.

In a step 500, the dielectric is turned over and then the second electrode 8 is deposited, for example by lithography. The second electrode may be solid or with cut outs.

If a system similar to that of FIG. 4 is to be created, in a step 600, the base material of a second electret is deposited in the slots 112 of the second electrode.

Then in a step 700, this material is polarised as for the first electret.

In a step 800, the preload may be adjusted, either to increase the preload of the dielectric, or to ensure the synchronisation of the different elements of the system in the case of a multi-layer system of the type shown in FIG. 6'. Indeed, in the case where the system has first 10 and second 110 electrets, and a multi-layer system is to be created by winding a strip around itself, the patterns of the first electret need to be synchronised with the patterns of the second electrodes of the layers upstream and downstream ortho-radially. Due to the superposition of the layers, the perimeter of the winding increases, the strip is therefore elongated so as to align ortho-radially the patterns. The ortho-radial alignment is also required between the patterns of the second electret with the patterns of the first electrodes of the upstream and downstream layers. To obtain correct operation in a multilayer structure with two types of electrets 10 and 110, it is important, as presented in FIG. 6', to have according to the thickness a succession of layers of the type 4, 6, 110, 6, 4, 6, 110, 6, 4, 6, 110, 6, 4 . . . that are alternated/juxtaposed with successions of the type 10, 6, 108, 6, 10, 6, 108, 6, 10, 6, 108, 6, 10, 6, 108 . . . . The electrodes 4 are thus always opposite electrets of the type 110 and next to electrets of the type 10 and electrodes 108 opposite electrets of the type 10 and next to electrets of the type 110.

In a step 900, it may be provided to wind the strip around itself to form a multi-layer system. It may be provided to insert a dielectric separator 1000 between each winding of the strip.

This example of a method has the advantage of permitting the simultaneous creation of the different steps on the different zones of the same dielectric strip, wherein each step is carried out successively on each zone of the strip.

Of course, the order of the above steps is in no way restrictive.

Furthermore, a variable capacitance system obtained by a classic manufacturing method, in which the same step is applied to all of the dielectric layer is within the scope of the present invention.

The invention claimed is:

1. A variable capacitance system comprising:
a first electrode;
a second electrode;
a layer of elastically deformable dielectric material positioned between the first and the second electrode;
a first electret forming with the first electrode a first capacitor, and the first electret forming with the second electrode a second capacitor, capacitances of the first and second capacitor varying with a deformation of the dielectric layer,
wherein the first electrode, the second electrode, and the first electret follow deformations of the dielectric layer and a deformation of the dielectric layer causes an inverse variation of the capacitances of the first capacitor and of the second capacitor,
the first electrode including at least two portions configured to move closer together or further away from one another, the first electret is positioned between the two portions of the first electrode, and edges of the two portions form with the first electret the first capacitor, and the first electret is on or in the dielectric layer.

2. A variable capacitance system according to claim 1, in which at least the first electrode includes at least one slot in which the first electret is located, wherein the edge of the slot forms with the first electret located in the slot the first capacitor, and the first electret is on or in the dielectric layer.

3. A variable capacitance system according to claim 2, in which the second electrode further includes at least one slot in which a second electret is located with a charge opposed to that of the first electret, so that the second electrode forms with the second electret a fourth capacitor of variable capacitance, and the first electrode forms with the second electret a fifth capacitor of variable capacitance, wherein capacitances of the first and fourth capacitors vary in a same direction, and the capacitances of the second and fifth capacitor vary in the same direction as the deformation of the dielectric layer.

4. A variable capacitance system according to claim 2, in which the first and/or a second electret is substantially located in a center of the slot or in a center of a zone defined by two successive turns substantially punctually.

5. A variable capacitance system according to claim 2, in which the first electret and/or a second electret fill the slot and is in contact with the edges of the slot, or the first electret and/or the second electret fills a zone defined by two successive turns, and is in contact with the turns.

6. A manufacturing method for a variable capacitance system according to claim 2, comprising:
depositing, or by lithography, the first electrode onto a face of the dielectric layer;
depositing a material, or Teflon, or parylene, designed to be polarized to form the first electret in at least one slot of the first electrode;
polarizing the material; and
depositing, or by lithography, the second electrode on the other face of the dielectric layer.

7. A manufacturing method according to claim 6, further comprising:
depositing a material, or Teflon, or parylene, designed to be polarized to form a second electret in at least one slot of the second electrode; and
polarizing the material.

8. A manufacturing method according to claim 6, further comprising applying an elongation preload to the dielectric layer, prior to depositing the first electrode.

9. A manufacturing method according to claim 6, further comprising adjusting a preload after polarizing the first or a second electret.

10. A manufacturing method according to claim 6, in which the dielectric layer is in a form of a strip whose zones undergo simultaneously the manufacturing method.

11. A manufacturing method according to the claim 10, in which at an end of the manufacturing method, the strip thus obtained is wound around itself to form a variable capacitance multi-layer system.

12. A variable capacitance system according to claim 1, which has a cylindrical form with a longitudinal axis and in which the first electrode is formed by a wound electrically conductive wire with a longitudinal axis forming a succession of turns, wherein the first electret is located between two successive turns.

13. A variable capacitance system according to claim 12, in which the second electrode further includes a wound electrically conductive wire with a longitudinal axis forming a succession of turns, wherein a second electret is located between at least two successive turns, and the turns of the first and second electrodes are offset so that the first and second electrets are not aligned according to a radial direction.

14. A variable capacitance system according to claim 12, in which the first and/or a second electret is substantially located in a center of a slot or in the center of a zone defined by two successive turns substantially punctually.

15. A variable capacitance system according to claim 12, in which the first electret and/or a second electret fills a slot and is in contact with the edges of the slot, or the first electret and/or the second electret fills a zone defined by the two successive turns, and is in contact with the turns.

16. A variable capacitance system according to claim 1, in which the second electrode includes a substantially solid layer and is covered by the dielectric layer, wherein the first electrode covers the dielectric layer on a face opposite to that in contact with the second electrode.

17. A variable capacitance system according to claim 1, in which the first electret and/or a second electret is formed by ionization of the dielectric layer defined by a slot, or by a corona method.

18. A variable capacitance system according to claim 1, in which the first electret and/or a second electret is in a form of a powder deposited on the dielectric layer.

19. A variable capacitance system according to claim 1, in which the dielectric layer is made of a polymer, or a polymer of type VHB®, or VHB4910®, and the first and second electrodes are made from copper, silver, silver grease, carbon powder, gold, conductive polymer, or in a form of an implantation of ions on a surface layer of the dielectric.

20. A variable capacitance system according to claim 1, in which the first and/or the second electrode has a structure that is elastically deformable.

21. A variable capacitance system according to claim 20, in which at least the first electrode includes at least one slot in which the first electret is located, wherein the edge of the slot forms with the first electret located in the slot the first capacitor, and the first electret is on or in the dielectric layer, and in which the first electrode and/or the second electrode is formed by a set of interconnected bars to form a lattice defining plural slots, inside each of which the first electret and/or a second electret is located.

22. A variable capacitance system according to claim 21, in which the lattice is such that a deformation of the lattice in one direction of its plane does not cause or hardly causes deformation in another direction contained in the plane.

23. A variable capacitance system according to claim 22, in which the bars form fir shapes positioned side by side connected electrically by ends of their branches.

24. A variable capacitance system according to claim 22, in which the bars form rows of parallel zigzag patterns, wherein the rows are electrically interconnected by interconnection bars extending between two successive rows.

25. A variable capacitance system according to claim 21, in which the lattice is such that a deformation of the lattice in one direction of its plane causes a deformation in another direction contained in the plane.

26. A variable capacitance system according to claim 25, in which the lattice includes rows of zigzag patterns, wherein two successive rows are offset by a half pitch, such that the zigzag patterns of two successive rows form rhomb shapes, and interconnection bars connect the points of the zigzag patterns of two successive rows, and these points are summits of the rhombs.

27. A variable capacitance system according to claim 21, in which the bars define honeycomb shaped slots.

28. A variable capacitance system according to claim 1, in which the first and the second electrode are such that the capacitance of the capacitor formed by the first and the second electrode separated by the dielectric layer is minimal.

29. A variable capacitance system according to claim 25, in which the second electrode is structured such that surfaces opposite the first and second electrodes are reduced or the second electrode includes slots.

30. An assembly of variable capacitance, comprising:
at least two systems according to claim 1,
wherein the systems are superposed and a dielectric layer is interposed between the second electrode of one of the systems and the first electrode of the other system.

31. A system for converting mechanical energy into electrical energy comprising:
at least one system according to claim 1,
wherein conversion of the mechanical energy into electrical energy takes place during a deformation phase of the dielectric layer from its initial form and during its return from a deformed form to its initial form.

32. A system for converting mechanical energy into electrical energy according to claim 31, of switch type, configured to send a command to an appliance, in which the electrical energy produced during a first deformation phase is used to send the command to the appliance, and the conversion system is thus self-powered.

33. A system for converting mechanical energy into electrical energy according to claim 31, which has a cylindrical form with a longitudinal axis and in which the first electrode is formed by a wound electrically conductive wire with a longitudinal axis forming a succession of turns, wherein the first electret is located between two successive turns, and in which the variable capacitance system has a form of a cylindrical sleeve, wherein the wire is wound along the axis of the sleeve, wherein the sleeve is fixed at its axial ends that have two elements that may move closer together or further away from one another along the axis of the sleeve, such that a relative movement of the two elements deforms the sleeve axially.

34. A system for converting mechanical energy into electrical energy according to claim 31, in which the second electrode is formed by a wound electrically conductive wire with a longitudinal axis forming a succession of turns, wherein a second electret is located between at least two successive turns, and the turns of the first and second electrodes are offset so that the first and second electrets are not aligned according to a radial direction, and in which the variable capacitance system has a form of a cylindrical sleeve, wherein the wire is wound along the axis of the sleeve, wherein the sleeve is fixed at its axial ends that have two elements that may move closer together or further away from one another along the axis of the sleeve, such that a relative movement of the two elements deforms the sleeve axially.

35. A conversion system according to the claim 33, in which the variable capacitance system comprises a rigid film between its layers on longitudinal ends of the sleeve fixed onto the elements.

36. A conversion system according to the claim 34, in which the variable capacitance system comprises a rigid film between its layers on longitudinal ends of the sleeve fixed onto the elements.

37. An actuator comprising:
at least one system according to claim 1,
wherein application of a voltage between the first and the second electrode causes a deformation in a mean plane of the system and/or in a direction that is orthogonal to the mean plane or a deformation along the longitudinal axis of a sleeve.

* * * * *

UNITED STATES PATENT AND TRADEMARK OFFICE
CERTIFICATE OF CORRECTION

PATENT NO. : 8,588,439 B2
APPLICATION NO. : 13/120805
DATED : November 19, 2013
INVENTOR(S) : Ghislain Despesse It is certified that error appears in the above-identified patent and that said Letters Patent is hereby corrected as shown below:

On the title page, Item (73), the Assignee's Information is incorrect. Item (73) should read:

--(73) Assignee: Commissariat a l'energie atomique et aux energies alternatives, Paris (FR)--

Signed and Sealed this
Eleventh Day of February, 2014

Michelle K. Lee
*Deputy Director of the United States Patent and Trademark Office*